United States Patent

[11] 3,581,303

[72] Inventor Franklin G. Kelly
Long Beach, Calif.
[21] Appl. No. 673,425
[22] Filed Oct. 6, 1967
[45] Patented May 25, 1971
[73] Assignee TRW Inc.
Redondo Beach, Calif.

[54] DIGITAL TO ANALOG CONVERTER
3 Claims, 1 Drawing Fig.

[52] U.S. Cl. .......... 340/347
[51] Int. Cl. .......... H03k 13/02, H03k 13/04
[50] Field of Search .......... 340/347; 307/242, 318

[56] References Cited

UNITED STATES PATENTS

| | | | |
|---|---|---|---|
| 2,963,698 | 12/1960 | Slocomb | 340/347 |
| 3,019,426 | 1/1962 | Gilbert | 307/242 |
| 3,223,994 | 12/1965 | Cates | 340/347 |
| 3,247,397 | 4/1966 | Kopek | 340/347 |
| 3,247,507 | 4/1966 | Moses | 340/347 |
| 3,258,765 | 6/1966 | Battzes | 340/347 |
| 3,341,713 | 9/1967 | Shaffer | 307/318 |
| 3,371,224 | 2/1968 | Polo | 307/242 |
| 3,400,257 | 9/1968 | Smith | 340/347 |

*Primary Examiner*—Maynard R. Wilbur
*Assistant Examiner*—Jeremiah Glassman
*Attorneys*—Daniel T. Anderson, Jerry A. Dinardo and Harry I Jacobs

ABSTRACT: A digital to analog converter includes a plurality of parallel connected circuits, each of which has a switching transistor in series with a calibrating or metering resistor. The metering resistors have resistance values that differ from each other by a multiple of two. The switching transistors each have an input terminal for reception of a digital input signal that switches the transistor on. When a transistor is switched on a current is produced that is proportional to the resistance value of the metering resistor in that particular circuit.

The currents are summed in a summing transistor and a summing resistor that are connected in series with the parallel connected circuits. The summing transistor is provided with means for clamping its emitter voltage on the base thereof. The different currents flowing through the summing transistor and summing resistor produce changes in the voltage across the summing transistor that are compensated by changes in the voltage across the emitter-collector of the summing transistor, while maintaining constant the voltage across the metering resistors. The voltage across the summing resistor is thereby a function only of the resistance values of the metering resistors.

PATENTED MAY 25 1971
3,581,303
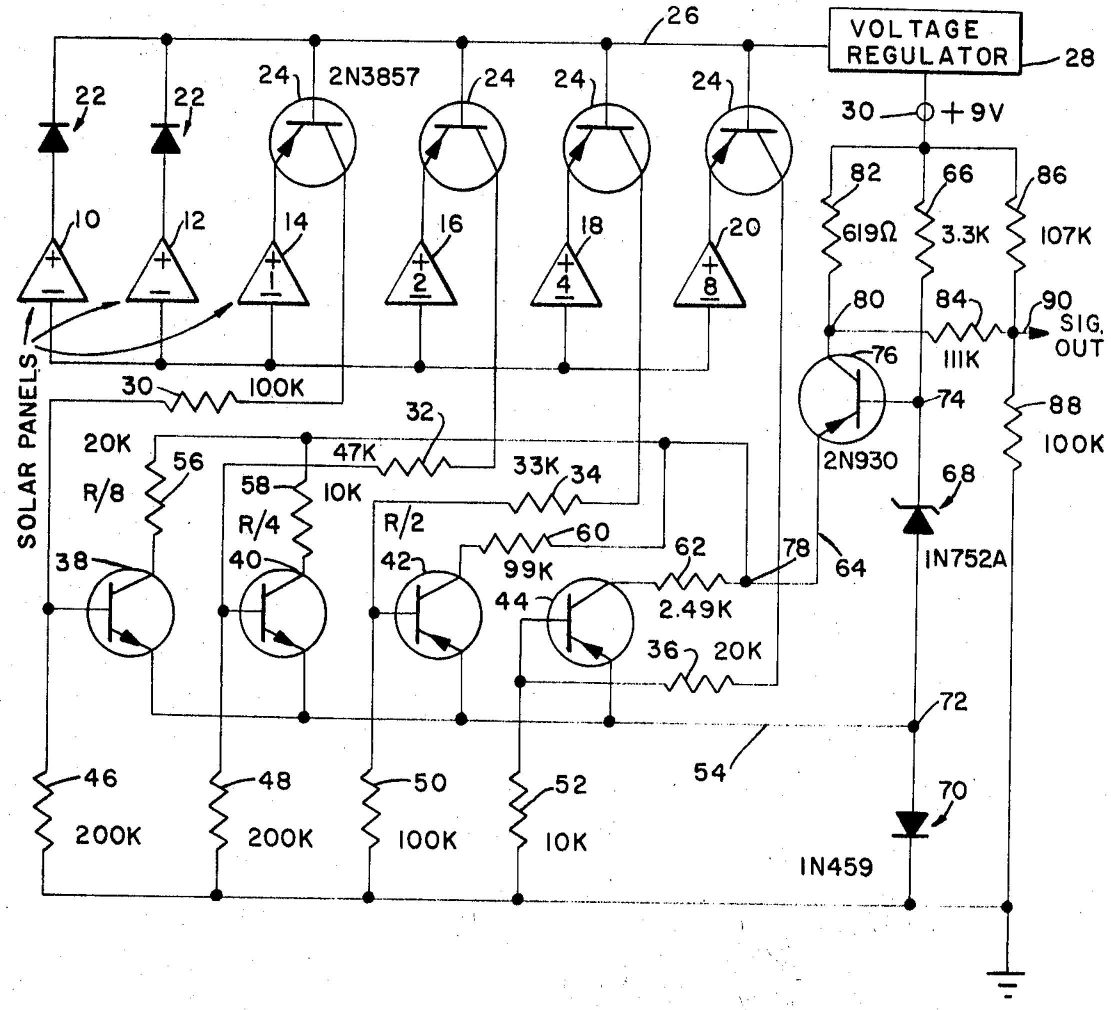
Franklin G. Kelly
*INVENTOR.*
BY Jerry A. Dinardo
AGENT

DIGITAL TO ANALOG CONVERTER

CROSS-REFERENCE TO RELATED APPLICATIONS

The digital-to-analog converter of the present application is disclosed in concurrently filed copending application, Ser. No. 673,415 of Franklin G. Kelly, entitled "Solar Cell Current Sensing Circuit."

BACKGROUND OF THE INVENTION

1. Field of the Invention

This invention relates to digital-to-analog converter circuits, and more particularly to improvements in such circuits which reduce errors in the analog output signal due to variable currents that flow in the load.

2. Description of the Prior Art

Digital-to-analog converter circuits usually employ transister switches which permit current to flow from a fixed voltage source through metering resistors into a summing junction and into another resistor. The latter serves to sum the currents generated and to provide an analog voltage across it proportional to the digital number fed into the circuit. This circuit suffers from a significant inherent error due to the variable current through the summing resistor. This necessarily varies the source voltage across the metering resistors which gives rise to an error. This error can be minimized by making the ratio of summing resistor to metering resistor very small. This does not compensate for the error but can reduce it.

SUMMARY OF THE INVENTION

In accordance with the invention, a digital-to-analog converter is arranged to have a plurality of parallel connected branches, each branch of which includes a metering resistor and a switch that is actuated by a digital input signal. The parallel connected branches are in series with a summing transistor and a summing resistor across a fixed supply voltage. The transistor is connected in such a way that the voltage across the branches remains fixed as the current flowing into the summing transistor and summing resistor changes upon actuating one or more of the switches in the parallel connected branches. In this way, the current through and the voltage across the summing resistor is a function solely of the different values of metering resistors that are switched into the parallel connected branches at any given time.

BRIEF DESCRIPTION OF THE DRAWING

The single FIGURE of the drawing is a schematic circuit of a solar cell current sensing circuit employing a digital-to-analog converter according to the invention.

DESCRIPTION OF THE PREFERRED EMBODIMENT

A solar cell current sensing circuit which employs a digital-to-analog converter constructed in accordance with the principles of the invention is illustrated in the drawing. There is shown two groups of solar cell panels, each panel comprising a multiplicity of solar cells. The first group of solar cell panels, such as the panels 10 and 12 are used solely to supply electrical power for the operation of systems within a spacecraft. The second group of solar cell panels, such as panels 14, 16, 18 and 20, also serve as power supplying panels, but in addition they are employed in a predesigned physical orientation on the spacecraft to relate the physical position of the spacecraft relative to the sun for the purpose of determining the attitude of the spacecraft. This attitude detecting system is more fully disclosed in my copending application, Ser. No. 607,409, filed Jan. 5, 1967, now U.S. Pat. Ser. No. 3,493,776.

The solar cell panels 10 through 20 of both groups are connected in parallel circuits. Each of the solar cell panels 10 and 12 of the first group is connected in series with a diode 22, which is preferably of the solid-state variety, such as a type 1N91. The solid-state diodes 22 are known as isolation diodes because they isolate unilluminated solar panels from the load. That is, they allow current to flow to the load in their conducting direction when the solar cell panels are illuminated, but they prevent current from flowing from the load bus into the solar cell panels when the latter are not illuminated.

Each of the solar cell panels 14 through 20 of the second group is in series with the emitter-base circuit of a transistor 24. The transistors 24 have their bases connected to a common bus 26. Likewise, the cathodes of the diodes 22 are connected to the bus 26. The transistors 24 are preferably of the type 2N3857.

The solar cell panels 10 through 20 may deliver an unregulated output voltage of about 11 to 17 volts on the bus 26. A voltage regulator 28 regulates this voltage to about 9 volts at terminal 30 for operating a digital-to-analog converter according to the invention, a preferred form of which will now be described.

The output emitter-collector circuit of each transistor 24 is connected in series with a current limiting resistor, such as resistors 30, 32, 34 and 36, respectively. The current limiting resistors 30, 32, 34 and 36 are connected to the bases of switching transistors 38, 40, 42 and 44 respectively. The bases of switching transistors 38 through 44 are returned to ground through resistors 46, 48, 50 and 52 respectively. The emitter of switching transistors 38 through 44 are connected to a common bus 54. The collectors of switching transistors 38 through 44 are connected through metering or calibrating resistors 56, 58, 60 and 62 respectively, to a common bus 64.

A voltage divider is connected between supply voltage terminal 30 and ground, and includes, and includes a resistor 66, a zener diode 68, such as a type 1N752A, and a solid state diode 70, such as a type 1N459, with a junction point 72 between diode 70 and zener diode 68, and a junction point 74 between zener diode 68 and resistor 66.

A summing transistor 76, such as a type 2N930 has its base connected to junction point 74 of the voltage divider, its emitter connected to common bus 64 at a junction point 78, and its collector connected to a junction point 80. A summing resistor 82 is connected between junction point 80 and supply voltage terminal 30.

Three signal conditioning resistors 84, 86 and 88 are connected in a voltage dividing network. Resistor 84 is connected between junction point 80 and an output terminal 90. Resistor 86 is connected between supply voltage terminal 30 and output terminal 90. Resistor 88 is connected between output terminal 90 and ground.

The operation of the digital-to-analog converter will now be described in connection with the solar cell current sensing circuit. As discussed previously, the solar cell panels 14 through 20 are arranged on a satellite so that when one or a combination of these solar cell panels is illuminated, a digital output may be produced therefrom which can feed to the digital-to-analog converter to produce an output signal representing the orientation of the satellite. Thus, when solar cell panel 14 is illuminated by the sun, it will generate a heavy current that flows in the emitter-base circuit of its associated transistor 24. This heavy current will cause current to flow in the emitter-collector circuit of the transistor 24, thereby providing a logic signal that is fed to the digital-to-analog converter. The output or logic current of the transistor will remain constant so long as the solar illumination intensity level is above a threshold in excess of the intensity level of illumination due to earthshine, as explained more fully in my concurrently filed copending application, Ser. No. 673,415 entitled "Solar Cell Current Sensing circuit."

Similarly, the other solar cell panels 16, 18 and 20, when sufficiently illuminated, will cause a constant current to flow in their respective transistor output circuits.

The digital currents flow through the current limiting resistors 30 through 36 which limit the currents to low values to prevent unnecessary losses.

The digital currents flow into the emitter-base circuits of the switching transistors 38 through 44 respectively. The switching transistors 38 through 44 are normally turned off by means of the bias voltage which is set by the diode 70 to about 0.6 volts. However, when the switching transistors 38 and 44 are turned on by the digital current, current will flow in the emitter-collector circuits of the switching transistors through the calibrating resistors 56 through 62 respectively. The value of current flowing through each of the calibrating resistors 56 through 62 is determined by their resistance values. In the example shown, calibrating resistor 62 has a resistance value R, while calibrating resistors 60, 58 and 56 have resistance values that are R/2, R/4 and R/8 respectively.

Now referring to the voltage divider network including resistor 66, zener diode 68 and bias setting diode 70, it is seen that the voltage across points 72 and 74 of the zener diode 68 is constant because of the clamping effect of the zener diode. The resistor 66 is used to set the current in the voltage dividing network to the operating range of the zener diode 68. In the particular example illustrated, the zener diode voltage is 7.5 volts. The summing transistor 76 is connected in a common base configuration. Thus, the emitter-current of transistor 76 is equal to the collector current minus a small amount of current flowing in the base. The voltage across points 74 and 78 is constant, so that the voltage across points 72 and 78 is constant. The current flowing through each of the calibrating resistors 56 through 62 is a function only of their resistance values.

Thus, when solar panel 14 is illuminated, a current having a digit value of 1 will flow through calibrating resistor 56. When solar panel 16 is illuminated, a current having a digit value of 2 will flow through calibrating resistor 56. When solar panel 18 is illuminated, a current having a digit value of 4 will flow through calibrating resistor 60. When solar panel 20 is illuminated, a current having a digit value of 8 will flow through calibrating resistor 62. The numerals appearing on the solar panels 14—20 correspond to their respective digit values.

The summing transistor 76 sums all these currents because they all flow into the emitter-base circuit and cause substantially the same current to flow in the collector-emitter circuit thereof and through the summing resistor 82. The current flowing through the summing resistor 82 and thus the voltage at point 80 is a function only of the resistance values of the calibrating resistors 56 through 62. The voltage at point 80 therefore is representative of the state of illumination of the solar panels 14 through 20.

While the analog output can be taken directly from point 80, it has been found convenient to employ the signal conditioning resistors 84 through 88 to adjust the bias output signal and the operating range of the output signal to satellite system requirements.

Although the transistors 24 in the solar cell current sensing circuit are shown as PNP type, they may be NPN. Likewise, while the switching transistors 38—44 and the summing transistor 76 are shown as NPN, they may be PNP.

I claim:

1. A digital-to-analog converter comprising:

a. a plurality of parallel connected circuits, each of said parallel circuits including:

a first switching transistor having an emitter, collector, and base, said base receiving a digital input signal through a first resistor, said base being connected through a second resistor to a first common point, said collector being connected through a third resistor to a second common point, said emitter being connected directly to a third common point;

b. a summing transistor having an emitter, collector, and base, the emitter of said summing transistor being connected to said second common point;

c. a voltage source;

d. said collector of said summing transistor being connected to said voltage source through a fourth resistor;

e. said base of said summing transistor being connected through a fifth resistor to said voltage source;

f. an output terminal;

g. said collector of said summing transistor being connected through a sixth resistor to said output terminal;

h. a seventh resistor connecting said output terminal with said voltage source;

i. a Zener diode connected between the base of said summing transistor and said third common point, wherein the anode of said Zener diode is connected to said third common point;

j. a diode connected between said third common point and said first common point, wherein the anode of said diode is connected to said third common point; and k. an eighth resistor connected between said first common point and said output terminal.

2. The invention according to claim 1 wherein the resistances of said third resistors are of graded size.

3. The invention according to claim 2 wherein said third resistors have resistance values that differ from each other by multiples of two.